US009151812B2

(12) United States Patent
Blumhagen et al.

(10) Patent No.: US 9,151,812 B2
(45) Date of Patent: Oct. 6, 2015

(54) METHOD TO OPERATE AN IMAGE-GENERATING MEDICAL MODALITY TO AVOID PATIENT INJURY BY A MODALITY-GENERATED ELECTROMAGNETIC FIELD

(71) Applicants: Jan Ole Blumhagen, Erlangen (DE); Gerhard Brinker, Erlangen (DE)

(72) Inventors: Jan Ole Blumhagen, Erlangen (DE); Gerhard Brinker, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 204 days.

(21) Appl. No.: 13/853,205

(22) Filed: Mar. 29, 2013

(65) Prior Publication Data
US 2013/0261428 A1    Oct. 3, 2013

(30) Foreign Application Priority Data

Mar. 30, 2012 (DE) .......................... 10 2012 205 236

(51) Int. Cl.
*A61B 5/05* (2006.01)
*G01R 33/28* (2006.01)
*G01R 33/54* (2006.01)
*G01R 33/565* (2006.01)

(52) U.S. Cl.
CPC ............ *G01R 33/288* (2013.01); *G01R 33/543* (2013.01); *G01R 33/56563* (2013.01); *G01R 33/56572* (2013.01)

(58) Field of Classification Search
None
See application file for complete search history.

(56) References Cited

U.S. PATENT DOCUMENTS

| 2003/0098688 | A1 | 5/2003 | Brinker et al. | |
| 2008/0290281 | A1* | 11/2008 | Martin et al. | ............ 250/363.03 |
| 2012/0056621 | A1 | 3/2012 | Blumhagen et al. | |
| 2012/0235680 | A1 | 9/2012 | Blumhagen et al. | |

FOREIGN PATENT DOCUMENTS

DE    102009019896 A1    11/2010

OTHER PUBLICATIONS

MRI Laboratory Saftey Manual, Ahmanson-Lovelace Brain Mapping Center, pp. 7.*
Blumhagen et al., "MR-based Axial Field-of-View Extension: Bipolar Dual-Echo Spin Echo Imaging Using Automatically Optimized Readout Gradients", Proc. 28th Annual Meeting ESMRMB, (2011).
Blumhagen et al., "Multislice 2D Spin Echo Imaging Using Adapted Readout Gradients for Compensation of B0 Inhomogeneities and Gradient Nonlinearities", Proc. 28th Annual Meeting ESMRMB, (2011).

(Continued)

Primary Examiner — Christopher Cook
(74) Attorney, Agent, or Firm — Schiff Hardin LLP

(57) ABSTRACT

In a method to operate an image-generating medical modality in order to avoid harm to a patient caused by an electromagnetic field, an adjustment process is implemented in which the electromagnetic field is radiated by the modality and preliminary image data are acquired using the electromagnetic field; and a clearance between the patient and a wall of the modality is determined from the image. The determined clearance forms the basis of a check process to determine an adaptation of the electromagnetic field for a diagnostic examination of the patient that follows. During the diagnostic examination, that also includes radiation of the electromagnetic field, movement monitoring of the patient takes place and the adjustment process is restarted as soon as a movement of the patient is registered.

8 Claims, 2 Drawing Sheets

(56) References Cited

OTHER PUBLICATIONS

Blumhagen et al., "MR-based Field-of-View Extension: Compensation of Field Imperfections", Proc. Intl. Soc. Mag. Reson. Med. 19, (2011), p. 2693.

J. O. Blumhagen, "MR-basierte Field-of-View-Vergrößerung in der Ganzkörper-MR/PET", ISMRM, (2011).

Buikman et al., "The RF Coil as a Sensitive Motion Detector for Magnetic Resonance Imaging", Magn. Reson. Imaging, 6(3), (1988), pp. 281-289.

Graesslin et al., "Advancements in Contact-free Respiration Monitoring using RF Pick-up coils", ISMRM 2010, Poster.

Graesslin, "Monitoring Safety and RF Heating for Parallel Transmission Systems", Philips Research Europe—Hamburg, ISMRM Workshop on MR Safety: RF Heating of the Human in MRI, (2010).

* cited by examiner

METHOD TO OPERATE AN IMAGE-GENERATING MEDICAL MODALITY TO AVOID PATIENT INJURY BY A MODALITY-GENERATED ELECTROMAGNETIC FIELD

BACKGROUND OF THE INVENTION

1. Field of the Invention

The invention concerns a method to operate an image-generating medical modality (in particular a magnetic resonance tomograph) and a corresponding image-generating medical modality.

2. Description of the Prior Art

A magnetic resonance tomography (MRT) apparatus frequently has a tube-like stationary unit with which the electromagnetic fields required for an imaging method are generated during operation. Such a tube-like stationary unit has a tunnel-like and centrally arranged opening or recess in which the generated electromagnetic fields act during operation, and in which a subject to be examined (a patient, for example) is positioned for an examination by means of imaging methods.

This tunnel-like recess is bounded by parts of the surface of the stationary unit that are designated herein as an inner tunnel wall. Located directly behind the inner tunnel wall are some of the assemblies of the stationary unit with which the electromagnetic fields are generated. When the spatial distribution of the time-dependent electromagnetic fields within the recess is considered, it appears that stronger alternating electromagnetic fields are active in close proximity to the inner tunnel wall of a magnetic resonance tomography apparatus than in the remaining regions of the recess. Therefore, in this immediate close proximity to the inner tunnel wall, there is an increased risk of so-called radio-frequency burns (RF burns) at which a tissue damage of a patient occurs due to injected radio-frequency radiation.

In the clinical field of MRT systems, patients sometimes come very close to the inner tunnel wall or even come into contact therewith, either due to the physical dimensions (for example corpulent and/or adipose patients) or due to asymmetrical positioning (for example in the examination of the elbow). The increased risk of radio-frequency burns must therefore be taken into consideration. Compliance with the recommended global SAR (Specific Absorption Rate) limits for the safe operation of cylindrical RF transmission coils (which are classified as volume coils in the IEC standard (60601-2-33) responsible for the safe operation of MRT systems) no longer safely protects against local RF burns wherein clearance is too small.

In order to avoid RF burns, two procedures have previously been established. The first is to significantly reduce the global SAR limits of the cited IEC standard (or possibly other limit regulations—FDA, for example) so that, for all operating conditions, no RF burn occurs even in the case of direct contact with the inner tunnel wall. However, this produces a marked reduction of the performance and, for example, an extension of the examination time within which the RF pulses are radiated, but also compromises with regard to the quality of the generated images (for example the use of sub-optimal flip angles or RF pulse shapes). In order to avoid the reduction of the performance from being too drastic, current MRT systems are often equipped with a contact protection function. The aforementioned limitation is thereby adjusted individually for the given situation (patient, figure, size, position relative to the RF transmission coil) by an assessment of individual measurement variables determining the local load (for example local E-fields, amperages in the conducting structures of the transmission antenna). Both variants frequently assume the cooperation and responsibility of the user (operator/technician) in that the user is enjoined to make sure that the patient has a minimum clearance (in mm) from the inner tunnel wall. This then enables the limitation of the performance to not be quite so drastically dimensioned. However, it is disadvantageous that the risk of an RF burn due to an incorrect operation of the system (here the positioning of the patient by the user) is increased. In the large majority of measurement situations, however, the clearance from the inner tunnel wall is greater than the critical distance x, which is typically ≤20 mm. The performance is therefore very often unnecessarily limited.

Alternatively or additionally, it is sought to produce a reduction or attenuation of the electromagnetic fields locally in close proximity to the inner tunnel wall by structural and technical measures, but this approach has an impermissibly high cost associated therewith.

From US 2003/0098688 A1 a method is known in which the position of the patient relative to the transmission antenna is determined exactly by an imaging magnetic resonance pre-measurement before the implementation of the actual measurement (thus the diagnostic examination of a patient by means of magnetic resonance imaging). On the basis of this exact position of the patient, the SAR (Specific Absorption Rate) values are then calculated in a known manner for planned parameters of the measurement from known patient data and the exactly determined position of the patient relative to the transmission antenna. The parameters are modified as necessary until the SAR values lie within the limit values, and the actual measurement for magnetic resonance imaging is subsequently implemented.

SUMMARY OF THE INVENTION

An object of the invention is to provide an improved method to operate an image-generating medical modality, and an improved image-generating medical modality.

Further features of the invention follow from the insight that a contact protection function of the aforementioned type is always active, although a patient to be examined comes critically close to the inner tunnel wall with a body part only in relatively few cases during the examination, particularly in systems known as "wide bore systems" (magnetic resonance tomography scanners with a tunnel diameter of more than 60 cm).

The inventive method serves to operate an image-generating medical modality, and in particular a magnetic resonance tomography scanner. It includes an adjustment process in which an electromagnetic field is generated by the modality and in which image data are generated with utilization of the electromagnetic field, with a clearance between the patient and a wall of the modality being determined on the basis of the image data. In addition, the determined clearance forms the basis of a check process to determine an adaptation of the electromagnetic field for the examination of the patient that follows the adjustment process. In this way the actual and current support (or even positioning) of the patient relative to the generated electromagnetic field and to the wall of the modality is determined with the use of the imaging modality, and on the basis of the positioning determined in such a manner it is then determined whether a repositioning of the patient is advisable and/or to what extent the generated electromagnetic field should be adapted for a subsequent examination of the patient, so that an advantageous electromagnetic field for the examination is generated, while it is ensured that the patient is not injured or harmed by the electromagnetic field in the examination.

Consideration is given to the fact that electromagnetic fields that are used to examine patients are potentially harmful to the patient and are not homogeneous with regard to the spatial distribution. Rather, a spatially dependent radiated power is to be assumed, such that the risk that a patient suffers harm or an injury depends on the position within the electromagnetic field. The radiation exposure of the patient thus exhibits local differences, and in some regions an undesirably high radiated power is sometimes present that entails an impermissibly high risk of an injury to the patient. In the case of the magnetic resonance tomography scanner, the resulting intensity of the local radiation exposure in the body of the patient (for example in the region of the skin) therefore very strongly depends on the position of the patient within the tunnel, and in particular the clearance from the inner tunnel wall. At a given mean radiated power, the maximum local radiation exposure can thus be tolerable in one position but can already produce an injury to the patient in another, more critical position. Instead of globally reducing the generated power of the electromagnetic field independently of the respective situation, according to the method a check is initially made as to whether the body of the patient extends at all to potentially critical regions. In the event that this is the case, the mean intensity of the electromagnetic field is then reduced beyond the predetermined global limits (that are provided by health authorities and international standards) in order to avoid a critical local radiated power within the body and at its surface.

In the example of a magnetic resonance tomography scanner that is noted above, potential critical regions are situated in the immediate proximity of the inner tunnel wall. If the minimum clearance of the patient from the inner tunnel wall is greater than a limit value x, then the compliance with the recommended global limits inherently ensures the safety with regard to a local endangerment of the patient. The limit value x depends on the model of the apparatus, in particular of the transmission coils. The limit value x for the clearance is typically between 5 mm and 20 mm. Within the scope of the inventive method, the smallest existing clearance between the patient and the inner tunnel wall is therefore determined and care is subsequently taken that this is always greater than the predetermined limit value x. The determination of the smallest existing clearance takes place by operation of the magnetic resonance tomography scanner itself, such that normally no additional hardware at all is required for this. Moreover, in this type of clearance determination, additional medical equipment that covers the patient during the examination does not have an interfering effect. In the event that it is determined that the minimum existing clearance is greater than the limit value x, the performance is then in no way more limited than is required by the necessary compliance with the global limits.

In all cases in which the body of the patient also extends in regions in which the allowed mean radiated power in the body of the patient (or at the patient's skin) would produce critically high local radiated powers at clearances greater than the limit value x, an adaptation of the electromagnetic field is determined, depending on the determined clearance that reduces the local radiated power, as long as that this reduction is assessed as non-critical even in the potentially critical regions into which the body of the patient protrudes. In this case as well, a blanket reduction of the global radiated power is thus not made; rather, the adaptation of the electromagnetic fields is situation-dependent (thus made depending on the determined clearance).

Moreover, the method to operate the image-generating medical modality includes a monitoring procedure, wherein a monitoring of movement of the patient takes place during the examination. It is thereby ensured that intentional or unintentional movements of the patient do not lead to the situation that the risk of injury (due to an increased local radiated power density within the body the patient or at its surface) hereby changes without being noticed by the operator of the medical modality. In addition, the adjustment process to determine the currently present minimum clearance is restarted as soon as a movement of the patient is registered. The clearance is initially determined once within the scope of the adjustment process and a simple, measurement-related monitoring is conducted during the movement monitoring. In the measurement-related monitoring it is not the change of the clearance that is determined but rather merely whether a relevant movement of the patient is present or not. Only if a relevant movement is registered is a redetermination of the modified clearance provided, wherein the examination is interrupted and the adjustment process is restarted.

In an embodiment of the method, the adaptation of the electromagnetic field (thus the adaptation of the mean intensity of the electromagnetic field) that is determined by the checking process within the scope of the adjustment process is conducted wholly automatically before the end of the adjustment process. This can mean, for example, that the operating parameters of the image-generating medical modality are preset wholly automatically for the following examination. The operating comfort for the corresponding medical modality can thereby be increased, and the probability of an operating error (for example due to an incorrect entry of an operating parameter) by an operator can be reduced.

An embodiment of the method in which a field-of-view enlargement method (abbreviated as: FoV method) is used is additionally preferred. Such a method is described in various publications (for example: Blumhagen J O, Ladebeck R, Fenchel M, Scheffler K, "MR-basierte Field-of-View-Vergrößerung in der Ganzkörper-MR/PET" ["MR-based field-of-view enlargement in whole-body MR/PET"], 14th annual conference of the DS ISMRM, 2011; Blumhagen J O, Ladebeck R, Fenchel M, Scheffler K., "Multislice 2D Spin Echo Imaging Using Adapted Readout Gradients for Compensation of BO Inhomogeneities and Gradient Nonlinearities", in Proc. 28th Annual Meeting ESMRMB, 2011; Blumhagen J O, Ladebeck R, Fenchel M, Scheffler K, "MR-based Axial Field-of-View Extension: Bipolar Dual-Echo Spin Echo Imaging Using Automatically Optimized Readout Gradients", in Proc. 28th Annual Meeting ESMRMB, 2011; Blumhagen J O, Ladebeck R, Fenchel M, Kampmeier J, Scheffler K, "MR-based Field-of-View Extension: Compensation of Field Imperfections", in Proc. 19th Annual Meeting ISMRM, 2011.

The FoV method is furthermore described in multiple unpublished German applications. According to DE 10 2010 044 520.7, for example, an axial FoV expansion can be achieved via a spatially dependent or local compensation of the gradient nonlinearities and the $B_0$ field inhomogeneities. Moreover, an applicability in the clinical routine can be achieved via the implementation of this method in what is known as a multislice spin echo sequence (as presented DE 10 2011 082 266.6) or in what is known as a Continuously Moving Table Acquisition (as shown in DE 10 2011 083

898.8). The entire disclosure content of these Applications is expressly referenced and herewith incorporated into the present Application.

Images of examination subjects can be created with the use of such a method, which images are in good approximation true to scale (and distortion-free) even outside of the typically specified field of view (abbreviated as: FoV). The basic principle of compensation of the resulting distortion of the gradient nonlinearities and the $B_0$ field inhomogeneities, which forms the basis of the FoV method, can thus be used in order to expand or enlarge the region that is suitable for imaging. However, the compensation that is necessary for an expansion of the field of view can sometimes be more difficult to produce than a local compensation in a relatively small region outside of the typically specified field of view, and the degree of difficulty also increases with increasing expansion.

Therefore, according to a method variant, no expansion of the FoV takes place, but rather individual image partial regions are used that are true-to-scale outside of the typically specified field of view (the FoV region is thus not enlarged, but rather is displaced). If it is known in advance in which region or in which partial regions the smallest given clearance exists between a patient and a wall of the image-generating medical modality, it is sufficient to scan this region or these partial regions within the scope of the adjustment process, and to determine the smallest existing clearance based on the corresponding image data. If it is assumed that the arms are closest to the wall, an image generation for a region around the one arm is initially conducted, and following this an image generation for a region around the other arm. In such a case, the image data of all partial regions (here two) must be taken into account in the determination of the smallest given clearance.

The compensation of the distortion due to the $B_0$ inhomogeneities and the distortion due to the gradient nonlinearities takes place in what is known as the frequency coding direction (this is typically what is known as the readout direction, and in a 2D excitation also in the slice selection direction), but not in what is known as the phase coding direction. In the phase coding direction, the $B_0$ inhomogeneity does not contribute to the distortion and thus also cannot be used for compensation of the distortion of the gradient nonlinearity. This residual distortion must then optimally be reduced with the aid of post-processing algorithms.

In addition to the clearance of the patient (thus for example of the arms) from the tunnel wall in the x-direction, the clearance of the patient (thus for example of the ribcage) from the tunnel wall in the y-direction is important to the adjustment process. Both clearances can be detected in that, in addition to a measurement with the readout direction in the x-direction (for the clearance determination in the x-direction), a measurement with the readout direction in the y-direction (for the clearance determination in the y-direction) is implemented. However, this is optionally implemented only in the event that the upper body actually protrudes out of the typically specified field of view, and a clearance determination cannot be implemented with conventional imaging.

In addition to this, in image generation the goal is less to achieve high resolutions or show details; instead, the goal is primarily to emphasize contours and present without distortion, wherein at the same time value is placed on acquiring the entire extent or at least the maximum extent of the examination subject, and preferably the entire region that is bounded by the inner tunnel wall. The smallest existing clearance between a patient and a wall of an image-generating medical modality can then be determined with relatively high precision and extremely reliably using these data, for example by means of a simple evaluation software or an evaluation circuit.

In a further embodiment of the method, parameter limitations are predetermined for the intensity of the electromagnetic field (particularly during the adjustment process) such that the intensity is kept so low that an endangerment is precluded. Since the clearance between the patient and the wall of the modality is determined within the scope of the adjustment process, and thus is unknown at the beginning of the adjustment process, in the case of the magnetic resonance tomographs the mean power density is reduced so far during the adjustment process that an endangerment can be precluded, even given a disadvantageous position and/or direct contact with the inner tunnel wall. This is preferably achieved by a generally suitable selection of the parameters for the adjustment process.

In a further embodiment, the adaptation of the electromagnetic field that is determined by the checking process includes an adaptation of the parameter limitations, such that the parameter limitations are respectively designed only to the necessary degree, depending on the established clearance. In a magnetic resonance tomography scanner, the necessary limitation typically increases more sharply than linearly with decreasing clearance. This dependency is to be individually stored for the given module, and advantageously is to be individually stored in software for the corresponding model.

In another embodiment, the adaptation of the electromagnetic field that is determined for the checking process includes an adaptation of the parameter limitations such that the parameter limitations are canceled when the determined clearance exceeds a threshold. The previously described example of the magnetic resonance tomography scanner is operated as follows based on the fact that—for example in the case of a smallest existing clearance greater the limit value x—the intensity or radiated power is no longer limited by the parameter limitation. Instead of this, the specification of the intensity or, respectively, radiated power takes place exclusively under consideration of the examination to be implemented and the global limits. For example, the IEC 60601-2-33 standard for magnetic resonance tomography scanner requires only the compliance with globally defined SAR (Specific Absorption Rate) for cylindrical volume coils. Due to the omission of the parameter limitation given sufficiently large clearance of the patient from the wall, the parameter settings of the image-generating medical modality can be optimized within the scope of the given possibilities solely to the advantage of an optimally short examination duration and/or optimally advantageous data generation. Furthermore, a variant of the method is advantageous in which the movement monitoring is made within the scope of the monitoring process without additional motion sensors. Instead, within the scope of the movement monitoring that is activated during the entire actual examination of the patient the influencing of the generated electromagnetic fields by the patient is monitored by means of measurement technology, for example in that the reflection and/or signals of what are known as pickup coils (PUCs) (insofar as they are present) are either monitored continuously or detected at sufficiently short time intervals and are compared with those present at the determination of the clearance. Some basic principles of such a movement monitoring have already been described in various documents and publications (Buikman D, Helzel T, Röschmann P., "The rf coil as a sensitive motion detector for magnetic resonance imaging", Magn Reson Imaging, 1988, 6(3):281-9; DE 10 2009 019 896 A1; Ingmar Graesslin, "Monitoring Safety and RF Heating for Parallel Transmission Systems", ISMRM, Workshop on MR Safety: RF Heating of the Human in MRI, 2010; I. Graesslin1, G. Mens2, A. Guillaume1, H. Stahl3, P. Koken1, P. Vernickel1, P. Harvey2, J. Smink2, K. Nehrke1 and P. Boernert1, "Advancements in Contact-free Respiration Monitoring using RF Pick-up coils", ISMRM 2010, Traditional Poster) with regard to the detection of respiratory and cardiac movement. By a positioning of the corresponding coils near the inner tunnel wall, the changes of the signals to be evaluated are markedly larger and can necessarily be differentiated by setting corresponding thresholds of respiration and cardiac motion.

The invention also encompasses an image-generating medical modality, such as a magnetic resonance tomography apparatus that has a control unit that is designed or configured to execute the previously described method.

DESCRIPTION OF THE PREFERRED EMBODIMENTS

Figure 1:
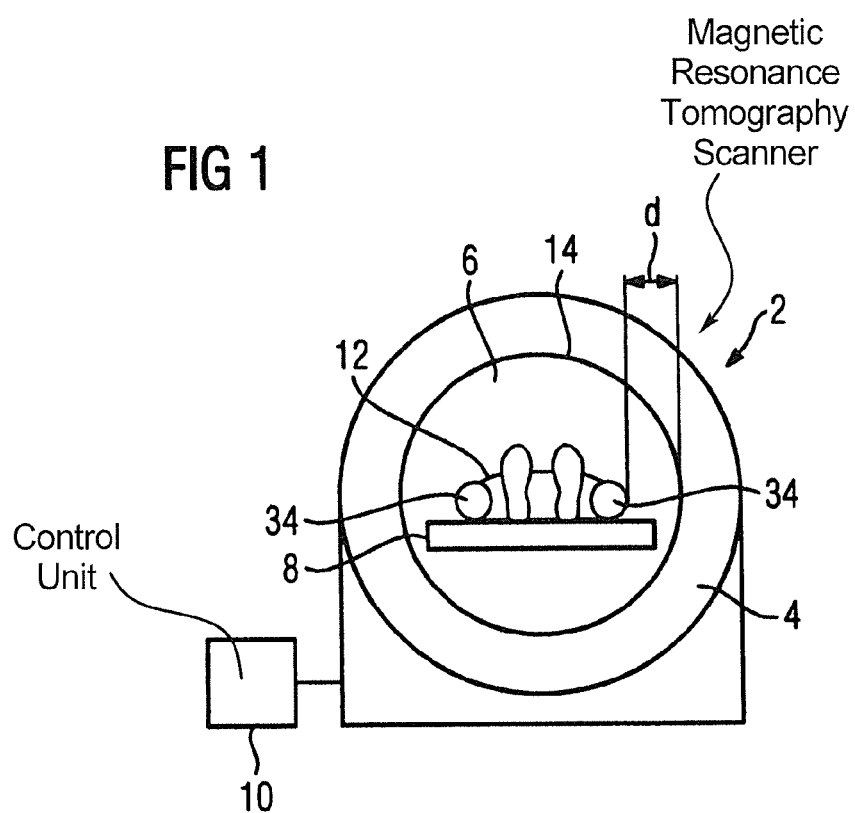
FIG. 1 schematically illustrates a magnetic resonance tomography apparatus according to the invention.

Parts corresponding to one another are respectively provided with the same reference characters in all figures.

For example, the method presented here is suitable for operation of a magnetic resonance tomography scanner 2 as it is schematically shown in FIG. 1. This includes a base unit 4 with a centrally arranged and cylindrical chamber (also called a tunnel 6 in the following), a patient table 8 and a control unit 10. Integrated into the base unit 4 is a coil arrangement (not shown in detail) that is designed according to a known principle for the generation of the required fields, thus a radio-frequency field, three low-frequency gradient fields and a static magnetic field. The individual modules/sub-coils of the coil arrangement are typically arranged around the tunnel with the radio-frequency coils inside the gradient coil coils, which in turn are inside the magnet that generates the static magnetic field. With the use of such a magnetic resonance tomography scanner 2, image-generating medical exams of patients can then be implemented according to a known principle. For this purpose, a patient 12 is positioned on the patient table 8. The patient table 8, together with the patient 12 positioned thereon, is moved into the tunnel 6 and exposed there to electromagnetic fields which are generated by the base unit 4.

Any radio-frequency electromagnetic field that primarily serves to deflect the nuclear spins also unavoidably produces a heating of the body of the patient 12 that is exposed to the electromagnetic field. The heating is locally expressed very differently. This is essentially applied to the inhomogeneous structure of the human body. If tissue is located in immediate proximity to the current-conducting structures of the radio-frequency transmission unit, due to direct field action this leads to a particularly intensive local power absorption in comparison to the further remote tissue. The radiated power of the radio-frequency radiation that the patient 12 is exposed to must be correspondingly limited. This can be achieved both by an extension of the time period within which the radio-frequency radiation is applied and a reduction of the radio-frequency amplitudes. The first cited option reduces both the cost-effectiveness of the system and the comfort for the patient that is offered by an optimally short examination time.

The last cited option leads to a reduced quality of the generated images. Which option is to be selected depends on the concrete application and must be decided upon by the operator of the system, for example. The method presented herein serves for the detection of whether an additional reduction of the performance beyond what is required at the basic level (given a merely global limitation) and—if yes—how large the individual dimension of the reduction is. For this reason, the method presented here is used in operation of the magnetic resonance tomograph 2.

According to the basic idea of the method, the extent of the body of the patient 12 as well as his position within the tunnel 6 are determined with the aid of the magnetic resonance tomograph 2, thus without additional sensors or hardware. On the basis of this information, the smallest given clearance $d_{min}$ between the body of the patient 12 and the wall of the base unit 4 in the region of the tunnel 6 (shortened to inner tunnel wall 14) is then determined by means of a software, and using this value it is finally established which parameter values are predetermined for the magnetic resonance tomograph 2 for the subsequent examination of the patient 12. For example, here it is established how large the value known as the "B1+" RMS value (RMS: root mean square) may be at a maximum ("B1+" designates that component of the radio-frequency electromagnetic field that causes the desired deflection of the nuclear spins out of the steady state). A typical measurement or control protocol thereby has a plurality of individual parameters. With regard to the "B1+" RMS value, the number of slices, what is known as the repetition time (TR), what is known as the flip angle, but possibly also the shape of the radio-frequency pulses that are used are significant. The combination of the values of the individual parameters then determines the resulting "B1+" RMS value. In the event that the given combination delivers too high a value, an automatically starting tool ("solver") is then preferably used that calculates suggestions so that, if these are complied with, the "B1+" RMS value no longer exceeds the predetermined limit.

Those parameter values establish (set) the manner in which the base unit 4 is controlled during the examination, such that the electromagnetic fields generated during the examination do not exceed the limit for the "B1+" RMS value that is configured for the extent and position of the body of the patient 12. Since the highest power absorptions in the magnetic resonance tomography scanner 2 typically occur in immediate proximity to the inner tunnel wall 14, and the intensity of the power absorption decreases with the distance from the inner tunnel wall 14, in order to reduce (striving toward elimination) the risk of injury to the patient 12, it is sufficient to determine the distance d of the patient 12 from the inner tunnel wall 14 and to limit the mean time value of the radio-frequency transmission power corresponding to the previously determined values, such that the patient 12 located in the tunnel 6 is not injured in the given position.

For an optimally precise determination of the smallest given distance $d_{min}$ between the body of the patient 12 and the inner tunnel wall 14, a field of view enlargement method is used, which is described in detail in the aforementioned documents and papers.

Figure 2:
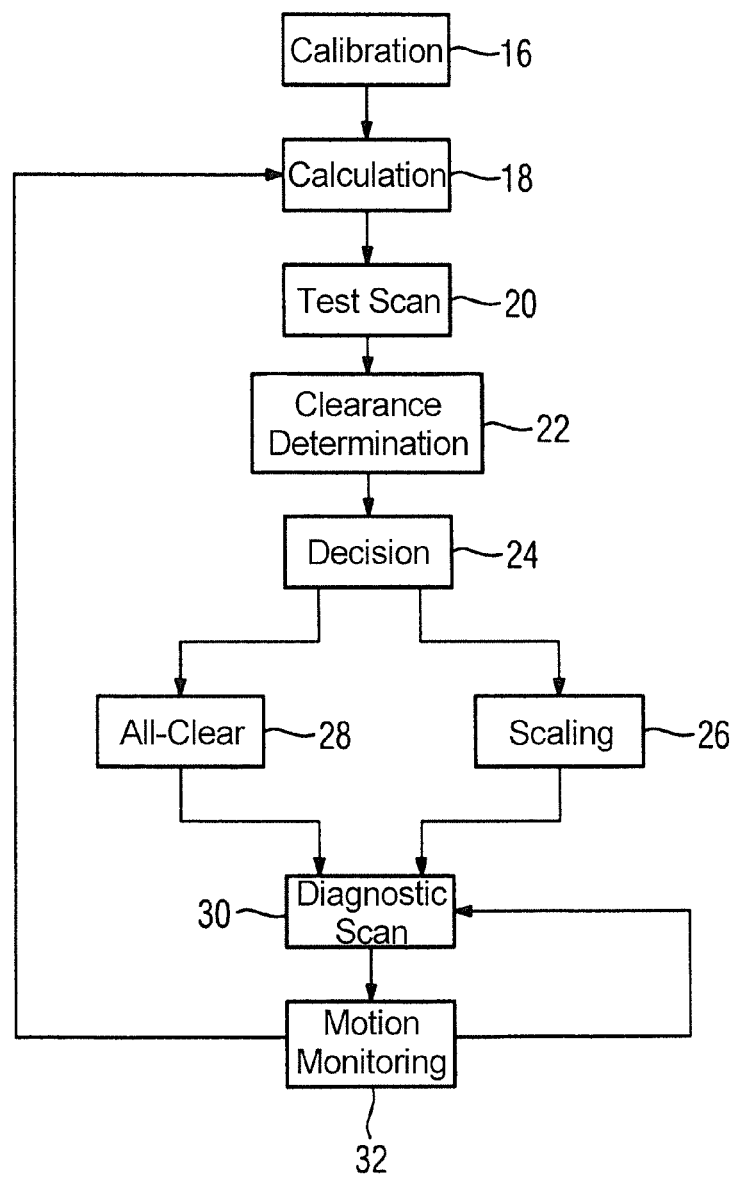
FIG. 2 is a flowchart of an embodiment of the method to operate the magnetic resonance tomography apparatus of FIG. 1 according to the invention.

In the workflow shown in FIG. 2, which represents an embodiment of the method according to the invention, such a field of view enlargement method is incorporated. This workflow includes a calibration step 16 in which the electromagnetic fields that can be generated with the base unit 4 are measured once, for example upon installation of the base unit 4. The measurement data that are acquired are thereupon stored in a memory of the control unit 10. The goal is to establish field inhomogeneities in the static (basic) magnetic field, and to establish parameter settings with which the aforementioned gradient fields (in particular the readout gradient) are to be generated in order to compensate for the resulting distortion of the gradient nonlinearities and the $B_0$ field inhomogeneities. The more effectively that this compensation takes place and the larger the region in which a good compensation can be enforced, fewer image distortions will occur in the images generated by means of the electromagnetic fields, and the larger the region that is mapped true-to-scale will be.

Within the actual adjustment process of the inventive method for an examination of the patient 12, at the beginning a calculation step 18 takes place in which a determination is made as to what parameter settings are most advantageous for the gradient fields, and in particular for the readout gradients, for a preliminary image generation or a test scan 20. The selection of parameter settings is limited by default so that no dangerous power absorptions in the patient 12 can be caused, even given contact with the inner tunnel wall 14. For example, for this purpose the radio-frequency transmission power applied during the test scan 20 is limited by the base unit 4. Under consideration of this limitation, suitable parameter settings for the test scan 20 are then calculated depending on the provided examination of the patient 12, and with the requirement that in the body contour of the patient 12 and the contour of the tunnel 6 (thus the inner tunnel wall 14) can be imaged without distortion.

The test scan 20 is then implemented utilizing the parameter settings determined in such a manner, with only a few individual slices of a limited region (or rather of a defined body region) are preferably being scanned for the image generation. For example, if it is assumed that the smallest existing clearance $d_{min}$ is between the body of the patient 12 and the inner tunnel wall 14 in the region of the ribcage, only individual slice presentations of the ribcage of the patient 12 are created within the scope of the test scan 20. The body region to be examined is always positioned in the middle of the tunnel for image data acquisition, and the radio-frequency coils/transmission coil are/is also arranged around this region. The transmission coil has a certain length in the direction of the longitudinal axis of the runnel 6. A typical value for this geometric length of the transmission coil—measured from the middle of the coil outwardly—is approximately 25 cm. This value (plus a safety margin) defines the region within which the smallest given clearance $d_{min}$ is to be established, generally from both sides. For example, in the event that the patient folds his or her hands over his or her stomach, in the case of a corpulent patient 12 the outer bones of the elbows tend to touch the inner tunnel wall 14. In this case, the region around the elbows must be detected in the test scan 20.

A clearance determination 22 is thereupon implemented by a software-based (algorithmic) evaluation of the image data generated in the test scan 20, in which determination the smallest existing clearance $d_{min}$ is determined between the body of the patient 12 and the inner tunnel wall 14. In a following decision process 24, either a scaling process 26 or an all-clear process 28 is started depending on the value of the determined smallest clearance $d_{min}$.

According to a further variant of the method, the smallest existing clearance $d_{min}$ is established, the required limit for the contact protection function for the "B1+" RMS value is calculated dependent thereon. If the clearance is sufficiently large, this limit is then not proper since a limit is also predetermined for the "B1+" RMS value based on other factors, with n a separate limit value being determined or predetermined for each basis/for each aspect. For example, legal requirements and standards are to be taken into account. The lowest limit value is then determined by computer, which is then used and predetermined as a limit value. If the all-clear process 28 is started, the protective function that limits the possible selectable parameter settings for the magnetic resonance tomograph 2 is canceled, and parameter settings for the examination of the patient that is to be conducted are subsequently selected that allow the best possible results to be expected within the framework of the setting possibilities.

If, instead, the scaling process 26 is started, depending on the determined value of the smallest given clearance $d_{min}$ the parameter limitations are modified by the contact protection function and the modified parameter limits are then taken onto account in the selection of suitable parameter settings for the actual examination of the patient 12. For example, if a power limit is provided by the contact protection function, the power limit is increased with an increasing value for the smallest given clearance $d_{min}$.

If the parameter settings for the examination of the patient 12 were established either via the scaling process 26 or via the all-clear process 28, the examination scan 30 (and thus the actual examination of the patient 12) is started and a movement monitoring process 32 is initiated. It should be noted that the values of the individual parameters are not necessarily themselves established by the establishment of the parameter settings; rather, it is preferably only ensured that the provided combination of the values of the individual parameters does not lead to the relevant standard being exceeded. For example, if a type of image known as a localizer scan should be implemented, its "requirement" with regard to the "B1+" RMS value is normally so low that the reset values of the individual parameters can always be used, independently of whether the limit is due to the contact protection function or due to the global SAR values.

Within the scope of the contact monitoring process 32 that is activated during the entire examination scan 30, the influencing of the electromagnetic fields (generated by means of the base unit 4) by the patient 12 is monitored in terms of measurement, and from this it is determined whether and how the patient 12 moves during the examination scan 30. The contact monitoring is thus a simple movement monitoring in which only a critical movement and a non-critical movement are differentiated in which, however, no continuous redetermination of the smallest given clearance $d_{min}$ between the body of the patient 12 and the inner tunnel wall 14 is conducted. For example, a slight muscle twitch or a breathing motion is considered as a non-critical movement in the sense of the movement monitoring process 32, and the movement of an arm 34 of the patient 12 towards the inner tunnel wall 14 is considered to be critical, for example.

As long as no critical movement at all is determined, the examination scan 30 is continued until it is terminated. By contrast, if a critical movement is registered, the examination scan 30 is interrupted and the adjustment process of the method that is presented here is started again by initiating the calculation step 18.

The influence on the electromagnetic fields (generated by the base unit 4) by the body of the patient 21 during the movement monitoring process 32 is preferably based on known (but adapted) principles and without additional hardware. The patient 12 is located in the absolute near field of a radio-frequency transmission antenna. Therefore, a close coupling of the patient 12 with the transmission antenna is provided. This has the effect that every movement of the patient 12 generates an influencing of the radio-frequency signals that is sufficient for detection, both along the transmission path and with regard to the generated radio-frequency fields. Suitable methods for detection are available from the previously cited literature that had the different goal of detection of breathing-dependent or heart beat-dependent movement for the purpose of reduction of "movement artifacts" in the generation of MR images, but the methods described in those sources can be used without limitation for the detection of a position change that is desired here. The cited methods either evaluate the time curve of the reflected radio-frequency signal (which can be detected by means of a directional coupler introduced into the transmission path) or monitor the generated radio-frequency fields that are detected by pick-up coils (PUCs) and are compared with the expected values. The pick-up coils are mounted at suitable locations near the transmission coil. The expected value is determined by the position that the patient 12 has in the initial state. If the patient 12 then moves, a deviation occurs between the expectation and the currently present measurement value. The described methods have already demonstrated that even the separation of respiratory movement and movement due to heart beat is possible. These methods are very sensitive to the load of the transmission coil, which is altered by movement. The closer the movement to the transmission coil, the stronger the change of the observed signal. By appropriate use of the indicated methods, it is possible to detect movement that takes place quickly in time as well as slowly proceeding movement.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to operate an image-generating medical modality, comprising:

operating an magnetic resonance (MR) image-generating medical modality, having a patient-receiving opening therein comprising an inner wall that a patient in said patient-receiving opening may contact, to acquire preliminary image data from the patient in an image-generating procedure that includes radiating an electromagnetic field;

providing said preliminary image data to a processor and, in said processor, automatically determining a clearance between the patient and said inner wall;

in said processor, using the determined clearance to adapt said electromagnetic field in order to set at least one parameter that defines radiation of the adapted electromagnetic field during operation of said MR image-generating medical modality in a subsequent acquisition of a diagnostic image of the patient; and operating said MR image-generating medical modality to implement said diagnostic image acquisition using said at least one parameter and, during said operation of said MR image-generating medical modality to acquire said diagnostic image data, (a) monitoring the patient to identify a movement of the patient and, (b) when said movement is identified, automatically re-determining said clearance and, as needed, re-adjusting said electromagnetic field to obtain a re-adjusted magnetic field and acquiring said diagnostic image data, after identifying said movement with said re-adjusted electromagnetic field, and repeating (a) and (b) until all of said data have been acquired.

2. A method as claimed in claim 1 comprising completing adapting of radiation of said electromagnetic field entirely automatically before beginning said acquisition of diagnostic image data.

3. A method as claimed in claim 1 comprising implementing a field of view enlargement method to generate said preliminary image data.

4. A method as claimed in claim 1 comprising entering predetermined parameter limitations for said electromagnetic field into said processor and using said predetermined parameter limitations to determine said parameter.

5. A method as claimed in claim 4 comprising determining said parameter by adapting said parameter limitations by a scaling of said parameter limitations dependent on the determined clearance.

6. A method as claimed in claim 4 comprising adapting said parameter limitations by canceling said parameter limitations if said determined clearance exceeds a clearance threshold.

7. A method as claimed in claim 1 comprising monitoring said patient to identify said movement solely by operation of said image-generating medical modality, without additional movement sensors.

8. An image-generating medical modality comprising:

a magnetic resonance (MR) tomography scanner having a patient-receiving opening therein comprising an inner wall that a patient in said patient-receiving opening may contact;

a processor configured to operate the MR tomography scanner to acquire preliminary image data from the patient in an image-generating procedure that includes radiating an electromagnetic field;

said processor provided with said preliminary image data, said processor being configured to automatically determine a clearance between the patient and said inner wall;

said processor being configured to use the determined clearance to adapt said electromagnetic field in order to set at least one parameter that defines radiation of the adapted electromagnetic field during operation of said MR tomography scanner in a subsequent acquisition of a diagnostic image of the patient; and said processor being configured to operate said MR tomography scanner to implement said diagnostic image acquisition using said parameter and, during said operation of said image acquisition unit to acquire said diagnostic image data, (a) monitor the patient to identify a movement of the patient and, (b) when said movement is identified, automatically re-determine said clearance and, as needed, re-adjust said electromagnetic field to obtain a re-adjusted magnetic field and acquiring said diagnostic image data, after identifying said movement with said re-adjusted electromagnetic field, and repeating (a) and (b) until all of said data have been acquired.

* * * * *